United States Patent
O'Brien et al.

(10) Patent No.: US 9,194,927 B2
(45) Date of Patent: Nov. 24, 2015

(54) SIMPLE METHOD TO DENOISE RATIO IMAGES IN MAGNETIC RESONANCE IMAGING

(71) Applicants: SIEMENS AKTIENGESELLSCHAFT, Munich (DE); ECOLE POLYTECHNIQUE FEDERALE DE LAUSANNE, Lausanne (CH)

(72) Inventors: Kieran O'Brien, Lausanne (CH); Alexis Roche, Jouxtens-Mezéry (CH)

(73) Assignees: Siemens Aktiengesellschaft, Munich (DE); Ecole Polytechnique Federale de Lausanne, Lausanne (CH)

( * ) Notice: Subject to any disclaimer, the term of this patent is extended or adjusted under 35 U.S.C. 154(b) by 43 days.

(21) Appl. No.: 14/177,708

(22) Filed: Feb. 11, 2014

(65) Prior Publication Data

US 2014/0226890 A1 Aug. 14, 2014

(30) Foreign Application Priority Data

Feb. 12, 2013 (EP) .................................... 13154916

(51) Int. Cl.
- *G06K 9/00* (2006.01)
- *G01R 33/56* (2006.01)
- *A61B 6/00* (2006.01)
- *G01R 33/565* (2006.01)

(52) U.S. Cl.
CPC ........ *G01R 33/5608* (2013.01); *G01R 33/5659* (2013.01)

(58) Field of Classification Search
CPC .............. G01R 33/00; G06T 5/00; A61B 5/00
USPC ......... 382/128, 129, 130, 131, 132, 133, 134; 378/4, 8, 21–27; 600/407, 410, 411, 600/425, 427

See application file for complete search history.

(56) References Cited

U.S. PATENT DOCUMENTS 7,907,760 B2 * 3/2011 Doyle ........................... 382/128

OTHER PUBLICATIONS

O'Brien K. et al; "A simple method to denoise MP2RAGE"; Proceedings of the International Society for Magnetic Resonance in Medicine, 21st Annual Meeting and Exhibition, Salt Lake City, Utah; vol. 21; pp. 269; XP055061678;; Apr. 6, 2013.

Marques J. P. et al; "MP2Rage, a self bias-field corrected sequence for improved segmentation and T1-mapping at high field"; Neuroimage, Academic Press, Orlando, FL; vol. 49; No. 2; pp. 1271-1281; ISSN: 1053-8119; XP026796256; Jan. 15, 2010.

(Continued)

*Primary Examiner* — Abolfazl Tabatabai

(74) *Attorney, Agent, or Firm* — Laurence Greenberg; Werner Stemer; Ralph Locher

(57) ABSTRACT

A simple method to denoise ratio images in magnetic resonance imaging, includes generating a MRI sequence provided for acquiring data from an object to be imaged, wherein the MRI sequence is configured for generating at least two different standard images, respectively a first standard image and a second standard image, acquiring the two different standard images, and combining the two different standard images in a ratio image. The ratio image is obtained by calculating a ratio of the first standard image and the second standard image that is tunable by a parameter γ wherein the parameter γ is automatically chosen for maximizing the negentropy of the ratio image.

8 Claims, 1 Drawing Sheet

(56) References Cited

OTHER PUBLICATIONS

Hyvärinen A. et al; "Independent component analysis: algorithms and applications"; Neural Networks, Elsevier Science Publishers, Barking; vol. 13; No. 4-5; pp. 411-430; ISSN: 0893-6080; DOI: 10.1016/S0893-6080(00) 00026-5; XP004213197; Jun. 1, 2000.

Van De Moortele Pierre-Francois et al; "T1 weighted brain images at 7 Tesla unbiased for Proton Density, T2* Contrast and RF coil receive B1 sensitivity with simultaneous vessel visualization"; Neuroimage, Academic Press, Orlando, FL; vol. 46; No. 2; pp. 432-446; ISSN: 1053-8119; DOI: 10.1016/J.Neuroimage.2009.02.009; XP026467914; Jun. 1, 2009.

\* cited by examiner

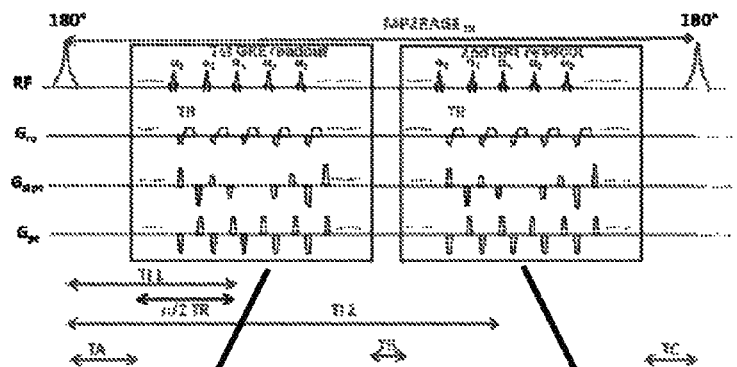
MP2RAGE
P
STANDARD
IMAGE
VOLUME
NP
STANDARD
IMAGE
VOLUME
C
COMPUTER
MACHINE
S
RATIO
IMAGE

SIMPLE METHOD TO DENOISE RATIO IMAGES IN MAGNETIC RESONANCE IMAGING

CROSS-REFERENCE TO RELATED APPLICATION

This application claims the priority, under 35 U.S.C. § 119, of European Patent Application EP 13 154 916.4, filed Feb. 12, 2013; the prior application is herewith incorporated by reference in its entirety.

BACKGROUND OF THE INVENTION

Field of the Invention

The invention relates to a method for automatically removing background noise in magnetic resonance (MR) imaging, and to a device for carrying out the method. In particular, the present invention is directed to removing noise in Magnetization-Prepared 2 Rapid Gradient-Echoes (MP2RAGE) ratio images.

At high static magnetic fields B0 (i.e. for B0≥3T) used for MR imaging, the transmit and receive radio frequency (RF) coils of a magnetic resonance imaging (MRI) scanner are very inhomogeneous. That causes unwanted intensity variations across an image which can impair clinical diagnosis. One method for removing that unwanted intensity variation is the MP2RAGE image acquisition technique that has been proposed by Van de Moortele et al., in Neuroimage 46, 432 (2009). The MP2RAGE image acquisition technique is an extension of the standard Magnetization-Prepared Rapid Gradient-Echo (MPRAGE) acquisition technique and is able to provide a bias-free T1 contrast with heavily reduced T2*13 weighting and Proton Density (PD)—weighting compared to the standard MPRAGE.

The MP2RAGE image acquisition technique includes:
generating a double-echo sequence, namely a first rapid gradient echo block at a first inversion time TI1 separated by a delay TB from a second rapid gradient echo block at a second inversion time TI2 for generating two different standard images at different inversion times and with different contrasts. The two standard images thus have different weighting but the same receive/transmit field in homogeneities and might be used for overcoming image quality degradation arising from spatial inhomogeneity in the transmit and receive RF coil B1 profiles that is observable in human MR images at the high static magnetic fields B0;
simultaneously acquiring the two different standard images that are preferentially and respectively a conventional 3D T1-weighted MPRAGE ($GRE_{TI1}$) image, acquired at a time delay or inversion time TI1 from a magnetization preparation RF pulse, and a 3D Gradient Echo-Proton Density ($GRE_{TI2}$) image, acquired at a second time delay TI2 from a magnetization preparation RF pulse, wherein 3D refers to 3 dimensional. The acquisition of the images is notably performed according to conventional MRI techniques by using a conventional MRI scanner;
combining the two different standard images in a ratio image obtained by calculating a normalized ratio between the two standard images, for example by dividing the $GRE_{TI1}$ magnitude image by the $GRE_{TI2}$ magnitude image. The normalized ratio between the two standard images provides a reduction of intensity field bias by eliminating signal variations induced by the receive RF coil B1 profiles and a removal of T2* and PD components. The ratio image is known on Siemens' MRI scanners as a "uniform" image and might be preferentially calculated using the following simple (1) or complex ratio (2):

$$S = \frac{|GRE_{TI1}|}{|GRE_{TI2}|} \tag{1}$$

$$S = \text{Re}\left(\frac{GRE_{TI1}^* \cdot GRE_{TI2}}{|GRE_{TI1}|^2 + |GRE_{TI2}|^2}\right) \tag{2}$$

wherein |x| refers to the magnitude of x and x* stands for the complex conjugate of x, x being $GRE_{TI1}$ or $GRE_{TI2}$.

The MP2RAGE image acquisition technique thus aims to produce unbiased high resolution T1-weighted 3D images relying on two 3D standard images that are otherwise frequently utilized on clinical scanners. The MP2RAGE image acquisition technique is also further described by Marques, et al. in the paper Neuroimage 49, 1271 (2010).

Although that approach has generated considerable interest in the MR community, it has unfortunately the disadvantage that combining the two different standard images in a ratio image amplifies the background noise of the ratio image. Besides being visually displeasing, the high background noise and the increased noise level in the meninges (tissues surrounding the brain) are problematic for registration and automatic segmentation algorithms. In particular, at 7T certain regions of the brain (e.g. the cerebellum) and the neck where the transmit B1 field is poorly distributed resulting in poor preparation of the magnetization, and which have low Signal Noise Ratio (SNR) in just one of the two different standard images, result in bright signal intensities in the ratio image. Those regions lose contrast and would also interfere with image analysis algorithms.

The background noise is a result of a numerical instability when dividing voxels, i.e. a volumetric pixel in a 3D image, with a very low SNR. If the intensity field biases are removed using the simple ratio given by Eq. 1, the value diverges when the signal of the denominator is low or noise. The complex ratio given in Eq. 2 has the advantageous property that it limits the intensity values of the image between −0.5 and 0.5 but remains numerically unstable when both modules are small. Moreover, since the phase points in any arbitrary direction when the SNR is low, then the background noise takes on a "salt and pepper" noise characteristic, spreading across the range −0.5 and 0.5 for intensity values.

Two solutions have been proposed to remove the background noise, The first solution is to generate a mask on one of the image data sets typically $GRE_{TI2}$ and to apply it to the ratio image (Van de Moortele et al., Neuroimage 46, 432 (2009)). Although straightforward, that approach risks a thresholding out data from inside the brain and therefore requires manual intervention by the user. The second solution multiplies the ratio image by the magnitude image of one of the data sets typically $GRE_{TI2}$, followed by a global rescaling or equalization of the image histogram (Fujimoto, et al., Proc. 20$^{th}$ ISMRM #130). That approach unfortunately reintroduces the intensity field biases that the image ratio intended to remove, thus defeating the features of the MP2RAGE image acquisition technique.

In addition, poor inversion in the cerebellum and neck results in a low SNR in either the $GRE_{TI1}$ or $GRE_{TI2}$ images. Consequently, regions of bright signal intensity appear in the ratio image, which cannot be removed by a simple threshold on $GRE_{T2}$ or would intensify using a multiplication and thus would still be present.

SUMMARY OF THE INVENTION

It is accordingly an object of the invention to provide a simple method to denoise ratio images in magnetic resonance imaging, which overcomes the hereinafore-mentioned disadvantages of the heretofore-known methods of this general type, which improves the image quality of the ratio images and which preferentially automatically removes the background noise generated in a ratio image obtained by the MP2RAGE image acquisition technique.

With the foregoing and other objects in view there is provided, in accordance with the invention, a MRI method, which comprises the steps of:

generating at least one MRI sequence, wherein a MRI sequence is an ordered combination of RF and gradient pulses provided for acquiring data from an object to be imaged, wherein the MRI sequence is configured for generating at least two different standard images respectively a first standard image P and a second standard image NP;

acquiring the two different standard images, notably by using a conventional MRI technique and using a conventional MRI scanner;

combining the two different standard images in a ratio image S, notably by using a computer machine; and obtaining the ratio image S by calculating a ratio of the first standard image P and the second standard image NP that is tunable by a parameter γ wherein the parameter γ is automatically chosen for maximizing the negentropy of the ratio image S.

In other words, the ratio that is in particular calculated by the computer machine, includes as parameters the first standard image P, the second standard image NP, and the parameter γ which value is automatically tuned in order to maximize the negentropy when calculating the ratio image S.

Preferentially, the MRI sequence uses a MP2RAGE image acquisition technique for acquiring the two different standard images and therefore includes the generation of a double-echo sequence, namely a first rapid gradient echo block at a first inversion time TI1 separated by a delay TB from a second rapid gradient echo block at a second inversion time TI2 for generating the two different standard images at different inversion times and in particular with different contrasts. Preferentially, the claimed method includes a simultaneous acquisition of the two different standard images, wherein the first standard image P and a second standard image NP are preferentially and respectively a conventional 3D T1-weighted MPRAGE ($GRE_{T1}$) image and a 3D Gradient Echo-Proton Density ($GRE_{T2}$) image.

Negentropy, a concept which originated in the context of independent component analysis (A. Hyvärinen and E. Oja, Neural Networks 13, 411 (2000)), is a measure of how much the image histogram differs from a Gaussian distribution. An empirical observation is that the noisier an image, the closer its histogram is to a Gaussian distribution. Therefore, negentropy may be viewed as a measure of the amount of noise removed from the conventional ratio image. The additional penalty on large offsets ensures that noise is not removed at the expense of re-introducing a significant bias field back into the image.

The present invention thus proposes a tunable modification of the standard image ratio calculations given by Eq. (1) or (2) that can be used to suppress the noise outside and inside the tissue and recover contrast in regions of low SNR. Preferentially, in the case of the MP2RAGE calculations, the present invention proposes to introduce the parameter γ into each ratio of the first standard image P and the second standard image NP as follows:

$$S = \frac{P}{NP + \gamma} \quad (3)$$

$$S = \text{Re}\left(\frac{P^* \cdot NP - \gamma}{P^2 + NP^2 + 2\gamma}\right) \quad (4)$$

and according to Eq. (1) or (2), Eq. (3) and (4) becomes preferentially $$S = \frac{|GRE_{T1}|}{|GRE_{T2}| + \gamma} \quad (5)$$

$$S = \text{Re}\left(\frac{GRE_{T1}^* \cdot GRE_{T2} - \gamma}{|GRE_{T1}|^2 + |GRE_{T2}|^2 + 2\gamma}\right). \quad (6)$$

Advantageously and preferentially, the possible values of the image intensities can be forced towards either 0 in the case of Eq. (5), or −0.5 in the case of Eq. (6), in particular when the voxel SNR is low or noise, After optimization of the parameter γ by using its automatic tuning to maximize the negentropy, most of the noise is removed from the ratio image therefore improving contrast characteristics in regions of low SNR without introducing a large bias into the ratio image.

In particular, in order to tune the values of the parameter γ so that it dominates noise without significantly impacting voxels with signal from the imaged object (Le, it should not (re)introduce a large bias into the ratio image), the present method proposes to individually customize the value of the parameter γ by maximizing the image negentropy for each image data set acquired preferentially by using the conventional MRI technique.

In order to remove noise while minimizing the bias introduced back into the ratio image, the parameter γ is preferentially tuned by maximizing the ratio image negentropy while subject to a penalty factor, e.g. maximizing the ratio image negentropy minus a penalty factor. For example, in the case of a linear penalty factor which may favor small offset values, γ is tuned by maximizing the image negentropy minus a positive constant times the parameter γ, with the positive constant times the parameter γ being the linear penalty factor.

Preferentially, the tuning or numerical optimization of the parameter γ can be carried out by using a standard line minimization algorithm, such as Brent's method, Newton's method or a quasi-exhaustive search. Advantageously, Brent's method allows a fast processing of the ratio image calculation, notably by using a standard single processor PC.

Other features which are considered as characteristic for the invention are set forth in the appended claims.

Although the invention is illustrated and described herein as embodied in a simple method to denoise ratio images in magnetic resonance imaging, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

The FIGURE of the drawing is a schematic and block diagram illustrating a preferred embodiment of the method according to the invention.

DETAILED DESCRIPTION OF THE INVENTION

Referring now in detail to the single FIGURE of the drawing, there is seen a preferred embodiment of the method according to the invention wherein a MP2RAGE image acquisition technique is used for the MRI sequence. The method includes:

generating a MRI sequence including a double-echo sequence, namely a first rapid gradient echo block at a first inversion time TI1 separated by a delay TB from a second rapid gradient echo block at a second inversion time TI2 for generating two different standard images at the first and second inversion times and in particular with different contrasts, wherein the following parameters are, for example, used: TR/TE 6 s/2.89 ms, TI1/TI2 0.8 s/2.7 s, Matrix 256×240×176, and voxel 1.0×1.0×1.2 mm, wherein TR, TE, TI1 and TI2 refer respectively, to the repetition time, the echo time, the first inversion time and the second inversion time;

simultaneously acquiring the two different standard images, respectively a conventional $GRE_{TI1}$ and $GRE_{TI2}$ magnitude and phase images;

combining the two different standard images in a ratio image S by using a computer machine C; and obtaining the ratio image S by calculating a ratio of the first standard image $GRE_{TI1}$ and the second standard image $GRE_{TI2}$ using Eq. (6), wherein the parameter γ is automatically chosen for maximizing the negentropy of the ratio image S over positive real numbers subject to a linear penalty to favor small offset values, and wherein numerical optimization is carried out using Brent's method, Additionally, the obtained ratio image S may be linearly transformed to scale between 0 and 4095.

Finally, in contrast to state of the art techniques, the present invention features the parallel acquisition of two standard image volumes, namely P and NP, notably by using a MP2RAGE image acquisition technique, wherein the standard image volumes have different contrasts but share the same spatial inhomogeneity in the transmit and receive RF coil B1 profiles, and calculates a ratio of the standard image volumes that is tunable by using a parameter γ, which value is automatically chosen free of any user intervention, so that:

i) the salt and pepper noise outside and inside the skull is removed;
ii) in regions of low signal intensity, the contrast is recovered (notably for the neck);
iii) structures become better delineated (notably the cerebellum), which would aid morphometry packages.

The present invention is thus based on a simple modification and optimization procedure to suppress the background noise that inherently occurs when taking the ratio of MR images. In the case of MP2RAGE scans, the result returns familiar T1-weighted images to the radiologist that have all the information intact i.e. with no direct noise removal that could potentially alter the diagnostic capabilities of the image.

Advantageously, the present method is appropriate to any image ratio. Indeed, appropriate modifications of the image ratio can, in particular, be achieved for numerically stabilizing the image ratio calculation. For example, numerical instabilities such as a division by zero and/or small numbers in the image ratio can be avoided by modifying the denominator of the simple ratio and by modifying the numerator and/or denominator of the complex ratio, In particular, the choice of the tunable parameter γ can be optimized for numerically stabilizing the image ratio calculation. In particular, the calculation of the image ratio while tuning the parameter γ might be subject to different penalty factors, like a linear or quadratic penalty factor, while using different optimization method for the calculation, such as the Brent's method. In particular, different penalty factors could be applied depending on the preference for noise suppression or maintaining bias-free image calculations. Therefore, the claimed method is opened to the use of different types of objective functions or mathematical optimization methods for tuning/optimizing the parameter γ when maximizing the negentropy.

The proposed combination of the standard image volumes is a tradeoff between the self-bias correcting properties of the ratio and numerical stability. The bias that is introduced in the brain is small (μ=−5.8%±5.5%) and is slowly varying across the brain, which is advantageously easy to correct in a later image segmentation step. The images visually improve; they appear like a customary T1-weighted image. The recovery of contrast in regions of low SNR and better delineation of structures with the proposed optimized calculation of the ratio image will aid morphometry packages, in particular the segmentation of the total intracranial volume which is a key step in brain tissue classification.

Indeed, in other fields, such as in digital image processing, the ratio of images is often performed in change detection i.e. to see if an object in the image has moved or in microscopy to remove illumination artifacts. However, in the latter the image ratio is not formed of pixels with pure noise or of pixels with very low SNR which give rise to the numerical instabilities seen when MRI images are combined such as in MP2RAGE. These approaches do suffer from a loss of dynamic range due to the ratio and consequently utilize a technique known as histogram equalization to recover the dynamic range. However, such techniques can not deal with the numerical instabilities induced by the noise seen in MP2RAGE, unlike the proposed approach.

The invention claimed is:

1. A magnetic resonance imaging method, comprising the following steps:
   generating a magnetic resonance imaging sequence provided for acquiring data from an object to be imaged, and configuring the magnetic resonance imaging sequence for generating at least two different respective standard images including a first standard image and a second standard image;
   acquiring the two different standard images;
   combining the two different standard images in a ratio image; and
   obtaining the ratio image by calculating a ratio of the first standard image and the second standard image being tunable by a parameter γ and automatically choosing the parameter γ for maximizing negentropy of the ratio image.

2. The method according to claim 1, which further comprises providing the ratio image by using one of the following equations:

$$S = \frac{|P|}{|NP| + \gamma} \text{ or}$$

$$S = \frac{P^* \cdot NP - \gamma}{|P|^2 + |NP|^2 + 2\gamma}. \qquad 5$$

3. The method according to claim 1, wherein the magnetic resonance imaging sequence is a MP2RAGE image acquisition sequence including a double-echo sequence, namely a first rapid gradient echo block at a first inversion time separated by a delay from a second rapid gradient echo block at a second inversion time for generating the two different standard images at the first and second inversion times.

4. The method according to claim 1, wherein the first standard image is a conventional 3D T1-weighted MPRAGE image, and the second standard image is a 3D Gradient Echo-Proton Density image.

5. The method according to claim 1, which further comprises tuning the parameter $\gamma$ by maximizing the ratio image negentropy minus a penalty factor.

6. The method according to claim 1, which further comprises tuning the parameter $\gamma$ by using a mathematical optimization method.

7. The method according to claim 6, wherein the mathematical optimization method is a standard line minimization algorithm.

8. The method according to claim 7, wherein the standard line minimization algorithm is a Brent's method, or Newton's method or a quasi-exhaustive search.

\* \* \* \* \*